United States Patent [19]
Singh

[11] Patent Number: 6,064,230
[45] Date of Patent: May 16, 2000

[54] PROCESS COMPENSATED OUTPUT DRIVER WITH SLEW RATE CONTROL

[75] Inventor: Gajendra P. Singh, Sunnyvale, Calif.

[73] Assignee: Sun Microsystems, Inc., Palo Alto, Calif.

[21] Appl. No.: 09/014,527

[22] Filed: Jan. 28, 1998

[51] Int. Cl.[7] ............................................. H03K 19/0175
[52] U.S. Cl. ................................ 326/83; 326/86; 326/80; 326/81
[58] Field of Search ................................. 326/80, 81, 83, 326/86, 121, 68, 27, 17, 16

[56] References Cited

U.S. PATENT DOCUMENTS

| | | | |
|---|---|---|---|
| 5,055,713 | 10/1991 | Watanabe et al. | 326/83 |
| 5,430,389 | 7/1995 | Kamiya | 326/27 |
| 5,568,081 | 10/1996 | Lui et al. | 327/380 |

OTHER PUBLICATIONS

"Dynamic Dielectric Protection For I/O Circuits Fabricated in a 2.5V CMOS Technology Interfacing to a 3.3V LVTTL Bus" John Connor et al., 1997 Symposium on VLSI Circuits Digest of Technical Papers.

Primary Examiner—Michael Tokar
Assistant Examiner—Anh Tran
Attorney, Agent, or Firm—Townsend and Townsend and Crew LLP

[57] ABSTRACT

A circuit which can compensate for process variations in controlling a drive transistor, whether for driving internal circuits or an output driver. A drive circuit is connected to the gate of the drive transistor, and is controlled by a control logic signal. In response to the control logic signal transitioning, the drive circuit will drive the gate to a voltage which is set depending upon the amount of process variation.

18 Claims, 4 Drawing Sheets

PROCESS COMPENSATED OUTPUT DRIVER WITH SLEW RATE CONTROL

BACKGROUND OF THE INVENTION

The present invention relates to the design of a dual voltage output buffer with compensation circuitry for variations in process and slew rate controlled output switching.

A typical personal computer or work station will have a number of semiconductor chips connected over a common bus. As the need for increased speed continues, the speed of the bus will get faster and faster. Accordingly, when a bus standard is adopted, a number of parameters for connecting to the bus need to be specified. For example, the "slew rate" of switching outputs connected to the bus must be within a specified range. The slew rate is the speed or slope of the signal as it transitions from a low to high or a high to low on the bus. Too fast a transition generates noise on the bus which can affect other devices. In addition, signals on the bus are often specified to have a required current drive capability. An example of such a bus is the 3.3 volt 66 MHZ PCI bus. The PCI standard specifies a slew rate range which must be met. To meet this, transistors must be sized to be fast enough, yet not be too fast and cause noise.

As integrated circuit chips become more and more dense, with transistor dimensions becoming smaller and smaller, it becomes increasingly difficult to control the characteristics of the devices. The amount of current produced by a transistor, which will affect the rate at which it will transition, and thus its slew rate, is affected by a number of factors. This current is given by the equation $I=K(W/L)(Vgs-Vt)^2$, where I=current, K=a constant dependent upon the process, W=the width of the transistor, L=the length of the transistor, Vgs=the gate-source voltage of the transistor, and Vt=the threshold voltage of the transistor. Although the width and length of the transistor can be specified for desired current drive capability, and the voltage across it can be designed to provide the desired gate-source voltage, the process dependent factor K can vary widely. This is due to the doping to create the P and N regions in the transistors being a chemical process done over a period of time, and from wafer to wafer the actual characteristics can vary based on slight variations in concentration and process time, which have a magnifying effect for a very small device size. Variations of up to 70% are typical.

One prior method for controlling the slew rate in drives uses staggered transistors, with each switched on a delayed amount of time later than the previous ones to limit the ramping. Another method involves using a bandgap reference circuit, counters, and an external resistance to determine if the process is a fast or slow process, and provide appropriate compensation using digital control. In one example, extra transistors in parallel can be provided, and can be switch connected or not depending on process variations. Clearly, such a method involves a significant amount of circuitry.

Additional design complications arise as designers attempt to make integrated circuits which operate with lower and lower voltage supplies to reduce power consumption and increase internal clock speed by having the transition shortened by shortening the levels to which the voltage must transition to. For example, circuits which operate on a 2.5 volt internal design are being designed. However, a difficulty is encountered when these circuits must interface with a bus which is standardized at a higher voltage, such as 3.3 volts.

SUMMARY OF THE INVENTION

The present invention provides a circuit which can compensate for process variations in controlling a drive transistor, whether for driving internal circuits or an output driver. A drive circuit is connected to the gate of the drive transistor, and is controlled by a control logic signal. In response to the control logic signal transitioning, the drive circuit will drive the gate to a voltage which is set depending upon the amount of process variation.

In one embodiment, the drive circuit includes a pulse-generating circuit in which the pulse length is controlled by the amount of P-process variation in driving the PMOS transistor, and by the amount of N process variation in driving an NMOS transistor. The pulse turns on a transistor which is connected to a constant current source, with the current source amount being designed to be independent of the amount of P or N process variation. Thus, (1) a controlled current ramp is provided, and (2) the stopping point of the ramp is controlled. The amount of voltage at the gate of the drive transistor can be controlled by controlling the duration that the ramp is on.

In one embodiment, the pulse is generated by a delay circuit consisting of multiple inverters. The inverters include PMOS and NMOS transistors. When an NMOS drive transistor is controlled, an inverter chain sensitive to N-process variations is used. Preferably, this is done by making the PMOS transistor in an initial inverter stage much larger than the NMOS transistor (larger than the normal two-times sizing difference to correct for the inherent characteristic of P transistors having one-half the conductivity of N transistors). The smaller NMOS transistor, driving the same capacitance, will thus have the dominant effect on the amount of delay.

For further understanding of the nature and advantages of the invention, reference should be made to the following description taken in conjunction with the company drawings.

DETAILED DESCRIPTION OF THE PREFERRED EMBODIMENTS

Figure 1:
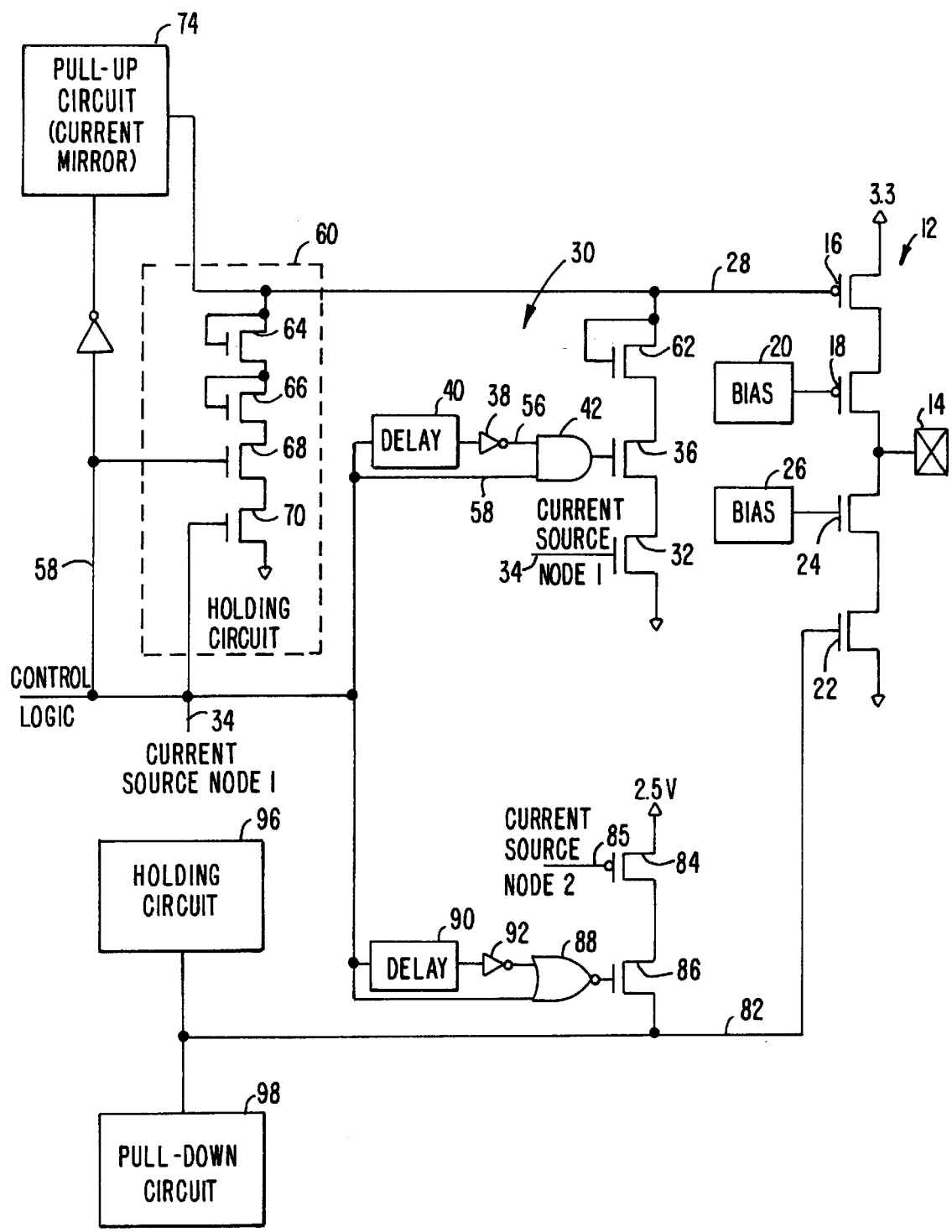
FIG. 1 is a diagram of a preferred embodiment of the invention at a high level employed in an output driver.

FIG. 1 is a diagram of one embodiment of the invention incorporated into an output driver for driving a 3.3 volt bus from internal 2.5 volt circuitry. FIG. 1 shows a drive circuit 12 connecting to an output pad 14. Drive circuit 12 includes a PMOS transistor 16 for driving to a high voltage level. A second PMOS transistor 18 is provided to avoid having 3.3 volts applied across the transistors, which are fabricated in a 2.5 volt process. Transistor 18 has its gate controlled by a first bias circuit 20. When the output is to be driven to ground, an NMOS transistor 22 is driven. A corresponding protection transistor 24 and its bias circuit 26 are provided.

The slew rate at pad 14 for a low to high transition is controlled by transistor 16. As described above, the transition time is a function of the current, which depends on process variations, the size of transistor 16, and the gate to source voltage between the 3.3 volt supply and the gate of transistor 16 (node 28). The present invention controls the slew rate by moving node 28 to a different voltage level depending upon the process variation factor, in other words, by varying Vgs. For example, where PMOS transistor 16 will be very fast due to the particular process, the speed is limited by using a smaller Vgs of around 1.7 volts, which can range up to about 2.6 volts if the process is slow. Thus, node 28 can be varied by as much as a volt depending upon the process variations.

As will be apparent, controlling the desired voltage of node 28 must be done by transistors which themselves will vary with the process, thus making this control difficult. The present invention accomplishes this with a voltage setting circuit 30. This voltage setting circuit uses a transistor 32 whose current mirrors a constant current source, with the current source control on line 34 being provided from a circuit which provides a constant amount of current regardless of variations in the process. In this manner, a constant ramp for ramping the desired voltage is generated on line 28. The voltage itself can be set by controlling the amount of time the ramp is on using a pulse generating circuit controlling a transistor 36. In the embodiment shown, the pulse generating circuit comprises a delay circuit 40, an inverter 38, and an AND gate 42. The duration of the pulse allows the desired voltage to be set as illustrated in FIG. 2.

Figure 2:
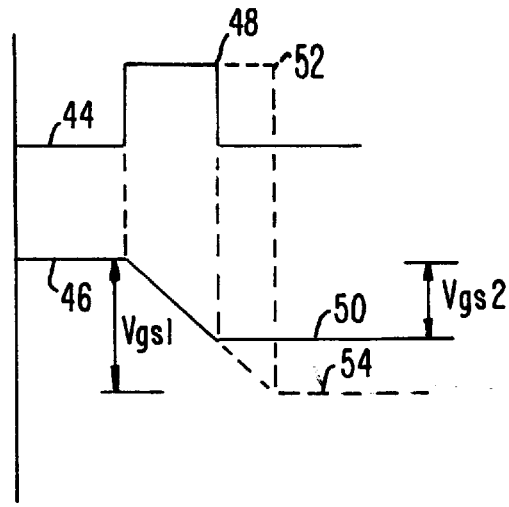
FIG. 2 is a graph illustrating the use of a pulse to control the Vgs voltage of the drive transistor.

FIG. 2 shows a first signal 44 representing an output of AND gate 42 to the gate of transistor 36. This pulse signal controls the voltage at node 28 as shown on a line 46. Node 28 will be pulled down sufficiently to turn on transistor 16 with the desired Vgs. By controlling the pulse width to end at a point 48, a desired voltage level 50 is provided, giving a gate-source voltage $Vgs_2$. If a lower voltage level, corresponding to a higher Vgs, is desired, the pulse can be maintained for an additional time 52, resulting in a lower voltage level 54, with a higher gate-source voltage $Vgs_1$. Thus, the present invention controls the slew rate of the signal on output pad 14 by controlling the Vgs of transistor 16.

The control of the duration of the pulse is done through delay circuit 40. Delay circuit 40 is constructed so that the amount of delay, corresponding to the width of the pulse, is dependent upon the P process variation. As can be seen, inverter 38 causes input 56 to AND gate 42 in FIG. 1 to initially be high when the control signal on line 58 is at a low level, thus providing a low output of AND gate 42 turning off transistor 36. When the control signal on line 58 is brought high, both lines 56 and 58 will initially be high, causing the initiation of the pulse shown in FIG. 2. Since inverter 38 will invert this control signal, line 56 will go low after the delay of delay circuit 40. When this happens, AND gate 42 will no longer have two high inputs, and its output will go low, turning off transistor 36 at the end of a pulse shown in FIG. 2. At this point, node 28 will be set to the desired voltage level to provide the Vgs voltage appropriate for the process variation to give a slew rate ramp of the desired slope.

Circuit 30 also includes a diode-connected transistor 62 to avoid too great of a voltage being applied across transistors 36 and 32.

Once transistor 36 is turned off, a holding circuit 60 takes over, and will drive node 28 to a voltage level of 2 diode drops, approximately 0.8 volts. These transistors keep node 28 from rising which would reduce the desired Vgs. The transistors of circuit 60 are configured to be small since they are used for holding purposes.

Holding circuit 60 consists of two diode-connected transistors 64 and 66, a control transistor 68 controlled by the control logic line 58 and a transistor 70 controlled by a current source node 34.

A pull-up circuit 74 is used to pull-up line 28 to turn off transistor 16 when transistor 22 is turned on to drive the output low, or when the drive goes to a tri-state condition. Pull-up circuit 74 includes a current mirror.

Similar logic, basically inverted, is used to provide the control to node 82 connected to the gate of NMOS drive transistor 22. Similarly, the gate voltage is set to provide a Vgs for transistor 22 corresponding to the NMOS transistor strength of the particular process to control the slew rate and absolute value of Vgs on the transition from high to low. This is done with a constant current source transistor 84 connected to a current source circuit on line 85, similar to transistor 32 for the PMOS drive transistor. Again, a control transistor 86 is used, controlled by a pulsing circuit consisting of an OR gate 88, a delay circuit 90 and an inverter 92.

Similarly to the PMOS drive transistor circuit, a holding circuit 96 is provided, as well as a pull-down circuit 98 for turning transistor 22 off when transistor 16 is being turned on.

Figure 3:
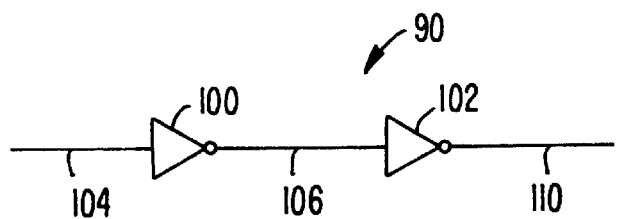
FIG. 3 is a diagram of the delay circuit of FIG. 1.

FIG. 3 illustrates delay circuit 90 of FIG. 1. It can be simply constructed from two inverters 101, 102. Alternately, a longer string of inverters could be used. The same concepts apply to delay circuit 40.

Figure 4:
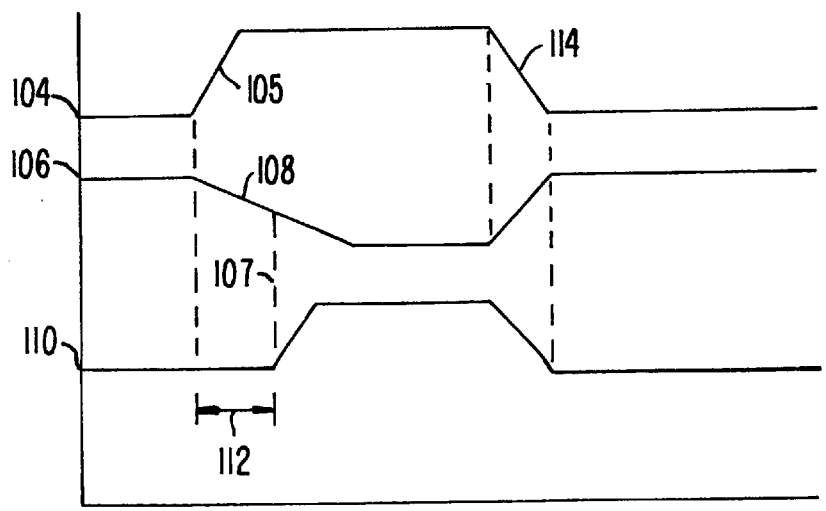
FIG. 4 is a graph illustrating the signal transitions of the delay circuit of FIG. 3.

FIG. 4 illustrates the effect of the delay circuit of FIG. 3. In the example shown, a control logic signal on line 104 of FIG. 3 produces an input pulse with an upward transition 105. This is translated into an inverted signal between the inverters on line 106, as illustrated in FIG. 4 as slope 108. In example shown, slope 108 is fairly slow, corresponding to a slow N process in a particular wafer. The output on line 110 of FIG. 3 will thus transition at a trigger point 107, which is delayed from slope 105 by an amount corresponding to the speed of the N process. The other transition of the pulse shown by slope 114 is a normal transition, since inverter 102 is a normal inverter with relatively bigger transistor sizes. The amount of delay achieved is shown by distance 112.

Figure 5:
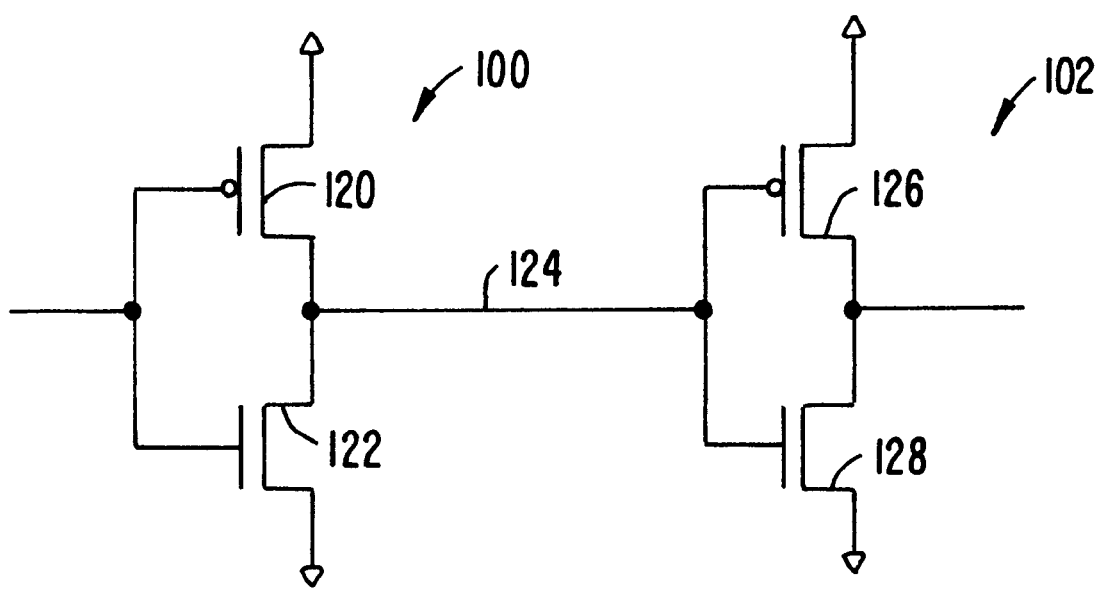
FIG. 5 is a more detailed circuit diagram of the delay circuit of FIG. 3.

FIG. 5 illustrates the delay circuit 90 in one embodiment in more detail. As shown, inverter 100 consists of a PMOS transistor 120 having its gate coupled to an NMOS transistor 122. The speed of the transition is determined by the amount of capacitance needed to be driven at common output node 124. This capacitance is the input capacitance of inverter 102, and the drain capacitance of transistors 120 and 122. The delay is made N-process dependent by making PMOS transistor 120 much larger than NMOS transistor 122, and making NMOS transistor 122 weak. Thus, when the PMOS transistor is driving, it will be able to quickly transition regardless of the process variation. However, the much weaker NMOS transistor 122 will be very sensitive to process variations in the NMOS transistor process, and thus will control the delay.

Typically, in MOS chip designs, the PMOS transistors are approximately two times as large as the NMOS transistors, since PMOS transistors inherently have about one-half the conductivity of NMOS transistors. Here, however, a much larger differential of at least five times as large, and more preferably approximately ten times as large is used. It is important to use a weak NMOS device to effectively track the delay of the NMOS process, and vice versa for PMOS.

The second stage of inverter 102 need not produce delay, but rather needs to invert the signal and provide the amplification needed. Thus, PMOS transistor 126 is the normal two-times sizing larger than NMOS transistor 128. Also, since inverter 102 serves the purpose of providing loading capacitance to inverter 100, the size of transistors 126 and 128 is much larger than a conventional inverter chain, where the chain is usually optimized for speed. In one embodiment, PMOS transistor 120 has a 20 micron (μ) width compared to 2μ for transistor 122. Transistor 126 could be 60μ, with transistor 128 being 30μ, or a similar ratio of strength.

For delay circuit 40 of FIG. 1, which needs to be dependent upon the PMOS process, the sizings can be reversed from that shown in FIG. 5, and the PMOS device of the first stage needs to be weak.

Figure 6:
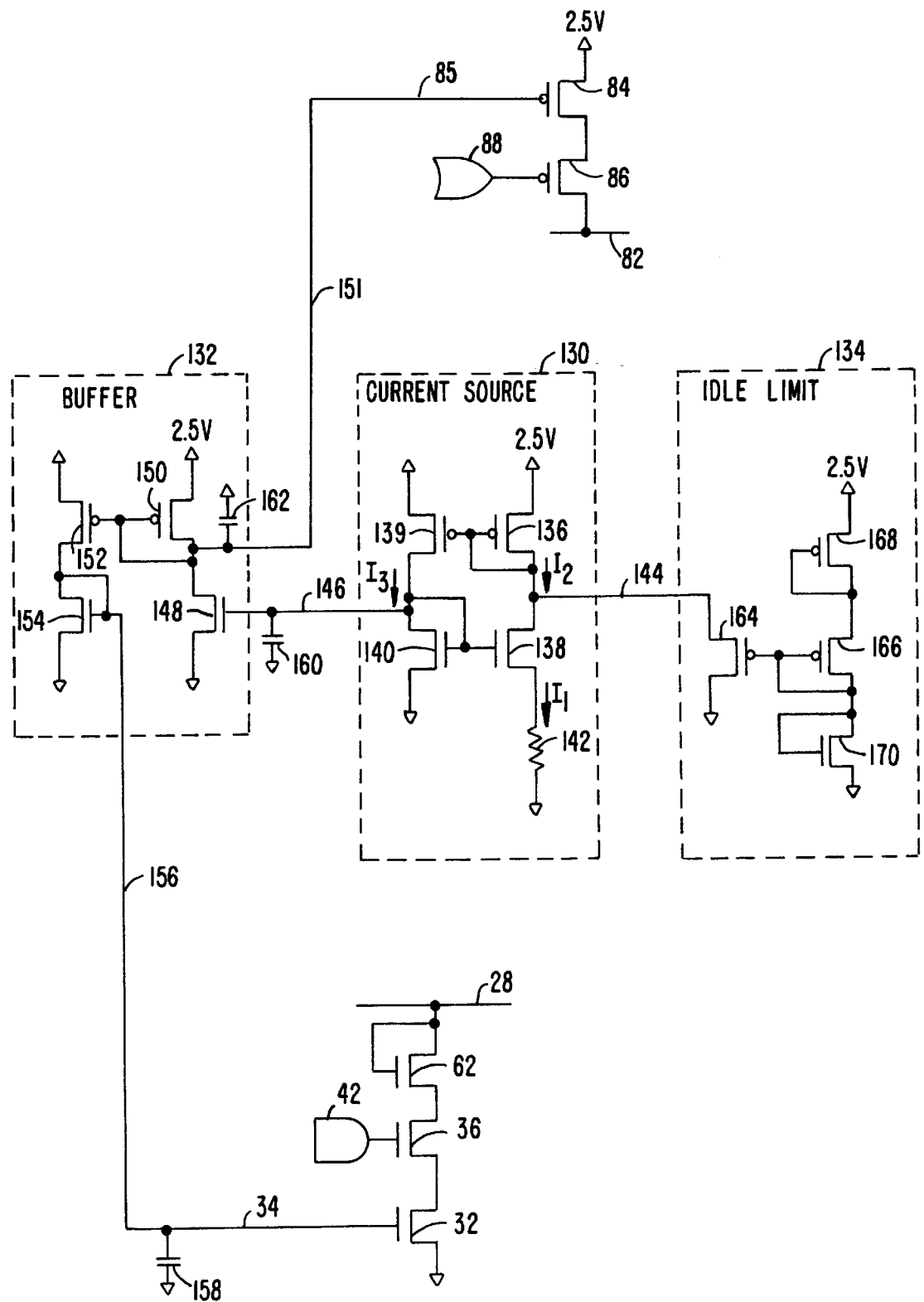
FIG. 6 is a circuit diagram of one embodiment of a current source as used in FIG. 1.

FIG. 6 illustrates one embodiment of the current source circuit for producing an amount of current which is fixed regardless of the process variations. This is illustrated for the connection a to transistors a 32 and 84 of FIG. 1, and a portion of circuit 30 is reproduced for illustration of where the connections are made.

A basic current source circuit 130 is provided to generate a current which can be used to generate the corresponding voltage on lines 34 and 85. A buffer circuit 132 is added to limit the size needed for circuit 130 and the amount of current drawn. Typically, circuit 130 might be produced centrally on a chip, with multiple buffers 132 connected to individual transistors like 32. Alternately, buffers 132 could be centrally located and signals could be routed to different transistors like transistor 32. An idle mode limiting circuit 134 prevents the current in the current source 130 from going to zero and turning off without the ability to being able to switch back on.

Current source circuit 130 includes a pair of PMOS transistors 136 and 139 connected as a current mirror, and coupled to a pair of current mirror connected NMOS transistors 138 and 140. The amount of current is set by a resistor 142, which preferably would be a precision resistor external to the chip. In operation, a current $I_1$ through transistor 138 is controlled by the size of resistor 142. In addition, this current is affected by the supply voltage and the voltage across transistor 138. As current $I_1$ increases, such as due to N process variations affecting transistor 138, current $I_2$ through transistor 136 will also increase. Since $I_1$ and $I_2$ are the same, and since transistors 136 and 139 are in the current mirror arrangement, this will cause a corresponding increase in current $I_3$ through transistor 139. This will increase the current in transistor 140, connected as a diode, which will raise the voltage at node 146. Since NMOS transistors 140 and 138 are connected in a current mirror type configuration, this will increase the Vgs voltage of transistor 138, tending to increase current $I_1$. While this might seem like a positive feedback loop, the higher current will increase the voltage across resistor 142, thus limiting the Vgs of transistor 138 and stabilizing it at the desired current level for both a current $I_2$ at node 144, and $I_3$ at node 146 by the negative feedback provided by resistor 142.

Circuit 130 is thus self-correcting for variations in both the NMOS transistor process and the PMOS transistor process. The feedback loop described above will compensate and produce the same current level regardless, as it is controlled by resistor 142. The voltage at node 146 thus represents, and is determined by, current $I_3$.

A buffer circuit 132 is connected to node 146. Transistor 148 mirrors the current in transistor 140 in a ratio depending on the size ratio between transistors 140 and 148. The current in transistor 148 decides the current in transistor 150. Transistor 152 mirrors the current in transistor 150, which also flows through transistor 154. Since transistor 154 is connected as a diode, the voltage at its gate, node 156, reflects the current in transistor 154 (while current ratios determine the buffering stability and strength, the voltage at node 156 will be the same as the voltage at node 146). Node 156 is then connected to input line 34 for transistor 32. Similarly, node 151 connects to line 85 which connects to the gate of transistor 84. Bypass capacitors 158, 160 and 162 are added to limit noise at the nodes shown.

Idle circuit 134 prevents current source 130 from going to zero during such situations as powering up of the chip. This is done using a PMOS transistor 164 which is connected as shown with a PMOS transistor 166. Transistor 166 is connected between a diode connected PMOS transistor 168 and a diode connected NMOS transistor 170. Transistor 170 is very small and provides a small leakage current, while transistors 166 and 168 are sufficiently big to provide approximately 2 diode drops at node 165. Thus, transistor 164 will pull down node 144 to a voltage sufficient to switch ON transistor 136. Once transistor 136 switches ON, the feedback mechanism of the current source will stablize the current source at its natural operation point.

Referring to FIG. 1, the 3.3 volt supply node for transistor 16, and the ground node for transistor 22, typically have a line inductance and capacitance which must be overcome when switching the transistors on. This resistance to a change in current causes the voltage at Vdd to drop when a P-driver switches, followed by an overshoot, giving ringing. Because the rate of change of Vgs of transistor 16 is controlled, the rate of change of current in 16 is also controlled, thus reducing the resistance provided by inductance, thus limiting the noise. The ideal transfer function for limiting this ringing would be a parabolic behavior of Vgs. The parasitic capacitance between the gate and source of these transistors converts the linear ramping provided by the current source circuit into a parabolic-like function at the gate of drive transistor 16, which is ideal for limiting the ringing noise. In one embodiment, it has been determined that the ground bounce due to ringing can be cut by more than half, from around 700 mV maximum to 300 mV maximum or less.

As will be understood by those of skill in the art, the present invention may be embodied in other specific forms without departing from the spirit or central characteristics thereof. For example, the present invention could be applied to 1.9 volt technology transistors, as opposed to 2.5 volt technology. Accordingly, the foregoing description is intended to be illustrative, but not limiting, of the scope of the invention which is set forth in the following claims.

What is claimed is:

1. A circuit for adjusting for process variations in controlling a drive transistor, comprising:

a control transistor coupled to a gate of said drive transistor;

a current source coupled to said control transistor; and a delay circuit coupled to a gate of said control transistor, said delay circuit having a delay primarily dependent upon a process dependent constant K in the equation for the current for said drive transistor, $I=K(W/L)(Vgs-Vt)^2$.

2. The circuit of claim 1 wherein said current source produces an amount of current independent of said process dependent constant K.

3. The circuit of claim 2 wherein said drive transistor is a PMOS transistor.

4. The circuit of claim 1 wherein one of a PMOS and an NMOS transistor in said delay circuit is disproportionately sized.

5. The circuit of claim 1 further comprising:
  a boolean logic gate having a first input coupled to said delay circuit and an output coupled to said gate of said control transistor;
  a control logic line coupled to said delay circuit and a second input of said boolean logic gate; and
  wherein said delay circuit produces an inverted signal.

6. The circuit of claim 1 wherein said delay circuit comprises:
  a first PMOS transistor and a first NMOS transistor connected at a first common node between a high and low voltage supply and having their gates coupled together;
  a second PMOS transistor and a second NMOS transistor connected at a second common node between a high and low voltage supply and having their gates coupled together to said first common node;
  wherein one of said first PMOS and NMOS transistors is more than 5 times as large as the other of said first PMOS and NMOS transistors.

7. The circuit of claim 6 wherein said first PMOS transistor is at least approximately 10 times larger than said first NMOS transistor.

8. The circuit of claim 1 wherein said current source comprises:
  a first transistor coupled between said control transistor and a voltage supply;
  a constant current source circuit having a first current mirror of PMOS transistors coupled to a second current mirror of NMOS transistors; and
  wherein said first transistor is connected in a current mirror configuration with one of said first and second current mirrors.

9. The circuit of claim 8 further comprising:
  a buffer circuit connected between said constant current source circuit and said first transistor.

10. A method for adjusting for process variations in controlling a drive transistor, comprising the steps of:
  providing a control signal for switching said drive signal; and
  driving a gate of said drive transistor to a first voltage in response to said control signal, said first voltage being a function of a process dependent constant K in the equation for the current for said drive transistor, $I=K(W/L)(Vgs-Vt)^2$.

11. The method of claim 10 wherein said driving step comprises:
  providing a constant current, an amount of said constant current being independent of said process dependent constant K; and
  coupling said constant current to said gate of said drive transistor for an amount of time which is a function of said process dependent constant K.

12. The method of claim 11 wherein said coupling step comprises the steps of:
  delaying and inverting said control signal to produce a delayed, inverted control signal, an amount of said delay being dependent on said process variation dependent constant K for one of N and P transistors;
  performing a boolean logic function of said control signal and said delayed, inverted control signal; and
  providing an output of said boolean logic function to said gate of said drive transistor.

13. A circuit for adjusting for process variations in controlling a drive transistor, comprising:
  a control signal line providing a control signal for switching said drive signal; and
  a drive circuit coupled to a gate of said drive transistor and configured to drive said gate to a first voltage in response to said control signal, said first voltage being a function of a process dependent constant K in the equation for the current for said drive transistor, $I=K(W/L)(VRs-Vt)^2$.

14. The circuit of claim 13 wherein said drive circuit comprises:
  a constant current source configured to provide a constant current, an amount of said constant current being independent of said process dependent constant K; and
  a coupling circuit configured to couple said constant current source to said gate of said drive transistor for an amount of time which is a function of said process variations.

15. The circuit of claim 14 wherein said coupling circuit comprises:
  a delay circuit configured to delay and invert said control signal to produce a delayed, inverted control signal, an amount of said delay being dependent on a process dependent constant K for one of N and P transistors;
  a boolean logic function circuit having a first input coupled to said control signal line, a second input coupled to an output of said delay circuit, and an output coupled to said gate of said drive transistor.

16. The circuit of claim 15 further comprising:
  a diode connected transistor connected to said gate of said drive transistor; and
  a control transistor connected to said diode connected transistor and having a gate connected to said output of said boolean logic function circuit.

17. A circuit for adjusting for process variations in controlling a drive transistor, comprising:
  a control transistor coupled to a gate of said drive transistor;
  a current source coupled to said control transistor, wherein said current source produces an amount of current independent of a process dependent constant K in the equation for the current for said drive transistor, $I=K(W/L)(Vgs-Vt^2$;
  a delay circuit coupled to a gate of said control transistor, said delay circuit having a delay primarily dependent upon said process dependent constant K;
  a boolean logic gate having a first input coupled to said delay circuit and an output coupled to said gate of said control transistor;
  a control logic line coupled to said delay circuit and a second input of said boolean logic gate; and
  wherein said delay circuit produces an inverted signal and said delay circuit includes
    a first PMOS transistor and a first NMOS transistor connected at a first common node between a high and low voltage supply and having their gates coupled together,
    a second PMOS transistor and a second NMOS transistor connected at a second common node between a high and low voltage supply and having their gates coupled together to said first common node,
    wherein one of said first PMOS and NMOS transistors is more than 5 times as large as the other of said first PMOS and NMOS transistors.

18. A computer system comprising:
  a memory;

a bus coupled to said memory;

a processor coupled to said bus, said processor including a circuit for adjusting for process variations in controlling a drive transistor, said circuit including a control transistor coupled to a gate of said drive transistor, a current source coupled to said control transistor, and a delay circuit coupled to a gate of said control transistor, said delay circuit having a delay primarily dependent upon a process dependent constant K in the equation for the current for said drive transistor, $I=K(W/L)(V_{gs}-V_t)^2$.

* * * * *